United States Patent [19]

Watanabe

[11] Patent Number: 5,130,946
[45] Date of Patent: Jul. 14, 1992

[54] PROTECTION OF DATA IN A MEMORY IN ELECTRONIC EQUIPMENT

[75] Inventor: Tsunehiro Watanabe, Tokyo, Japan

[73] Assignee: Canon Kabushiki Kaisha, Tokyo, Japan

[21] Appl. No.: 737,904

[22] Filed: Jul. 26, 1991

Related U.S. Application Data

[63] Continuation of Ser. No. 515,684, Apr. 26, 1990, abandoned, which is a continuation of Ser. No. 18,458, Feb. 25, 1987, abandoned.

[30] Foreign Application Priority Data

Feb. 28, 1986 [JP] Japan .................................. 61-41715

[51] Int. Cl.$^5$ ............................................. G11C 13/00
[52] U.S. Cl. ..................... 365/189.01; 365/230.01
[58] Field of Search ............ 365/189.01, 230.01, 365/189.04, 221

[56] References Cited

U.S. PATENT DOCUMENTS

| | | | |
|---|---|---|---|
| 3,737,879 | 6/1973 | Greene et al. | 365/222 |
| 3,760,379 | 9/1973 | Nibby, Jr. et al. | 365/222 |
| 3,858,184 | 12/1974 | DeVries | 365/222 |

Primary Examiner—Terrell W. Fears
Attorney, Agent, or Firm—Fitzpatrick, Cella, Harper & Scinto

[57] ABSTRACT

Electronic equipment having a memory for storing information comprises detection means for detecting a state requiring the writing of information into the memory, and gate means for controlling a write enable signal to the memory in accordance with the output of the detection means.

12 Claims, 6 Drawing Sheets

PROTECTION OF DATA IN A MEMORY IN ELECTRONIC EQUIPMENT

This application is a continuation of application Ser. No. 07/515,684 filed Apr. 26, 1990, now abandoned, which is a continuation of application Ser. No. 07/018,458 filed Feb. 25, 1987, now abandoned.

BACKGROUND OF THE INVENTION

1. Field of the Invention

The present invention relates to electronic equipment having a memory.

2. Related Background Art

In a prior art electronic equipment of this type, there may be a risk that data stored in a RAM is destroyed because the RAM is normally in a writable state. Causes of data destruction are static electricity, malfunction due to external noise, and programming overrun of a processor such as a CPU which processes the data stored in the RAM. For example, in a facsimile machine, power is turned on 24 hours a day and the chance of data destruction is high. The data may also be destroyed by a malfunction due to electrostatic noise generated by a paper feed.

The necessity of modifying the data stored in the RAM is very little in normal operation, except when the RAM is used as a register, and in many cases it is read-only. Such a RAM may be substituted by a ROM, but when a ROM is used, a modification of data at a customer site is not possible. Such modification of the data is required, for example, in a highly intelligent facsimile machine, to store information peculiar to the customer, such as telephone numbers of senders and senders. If a rewritable ROM (EEPROM) is used instead of the ROM, the rewriting on site is attained but it is relatively expensive and has problems in durability and reliability.

SUMMARY OF THE INVENTION

It is an object of the present invention to improve such electronic equipment.

It is another object of the present invention to resolve the problems described above.

It is another object of the present invention to provide electronic equipment which can disable writing of a memory except when rewriting is required.

It is another object of the present invention to provide electronic equipment which prevents data of a memory from being destroyed by malfunction due to noise.

It is another object of the present invention to provide electronic equipment which protects data of a memory with a simple construction.

Other objects, and features and advantages of the present invention will be apparent from the following description of the preferred embodiments of the invention.

DETAILED DESCRIPTION OF THE PREFERRED EMBODIMENTS

Figure 1:
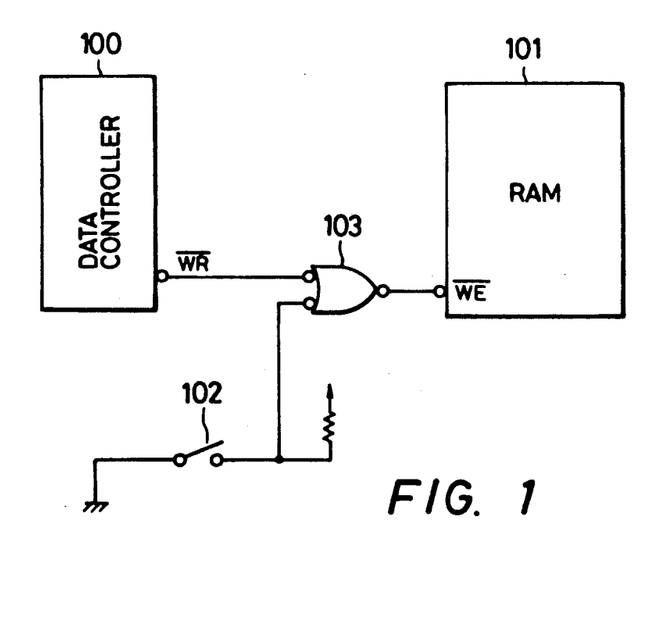
FIG. 1 shows a basic configuration of an embodiment of the present invention.

FIG. 1 shows a basic configuration to explain an outline of the embodiments.

The electronic equipment shown in FIG. 1 comprises a RAM 101 for storing data, a data controller 100 for controlling reading and writing of data in and from the RAM 101, a switch 102 and a gate 103.

The RAM 101 is used by the data controller 100 normally in a read-only state. When writing of data to the RAM 101 is required, the switch 102 is closed to open the gate 103 so that the RAM 101 is write-enabled.

Figure 2:
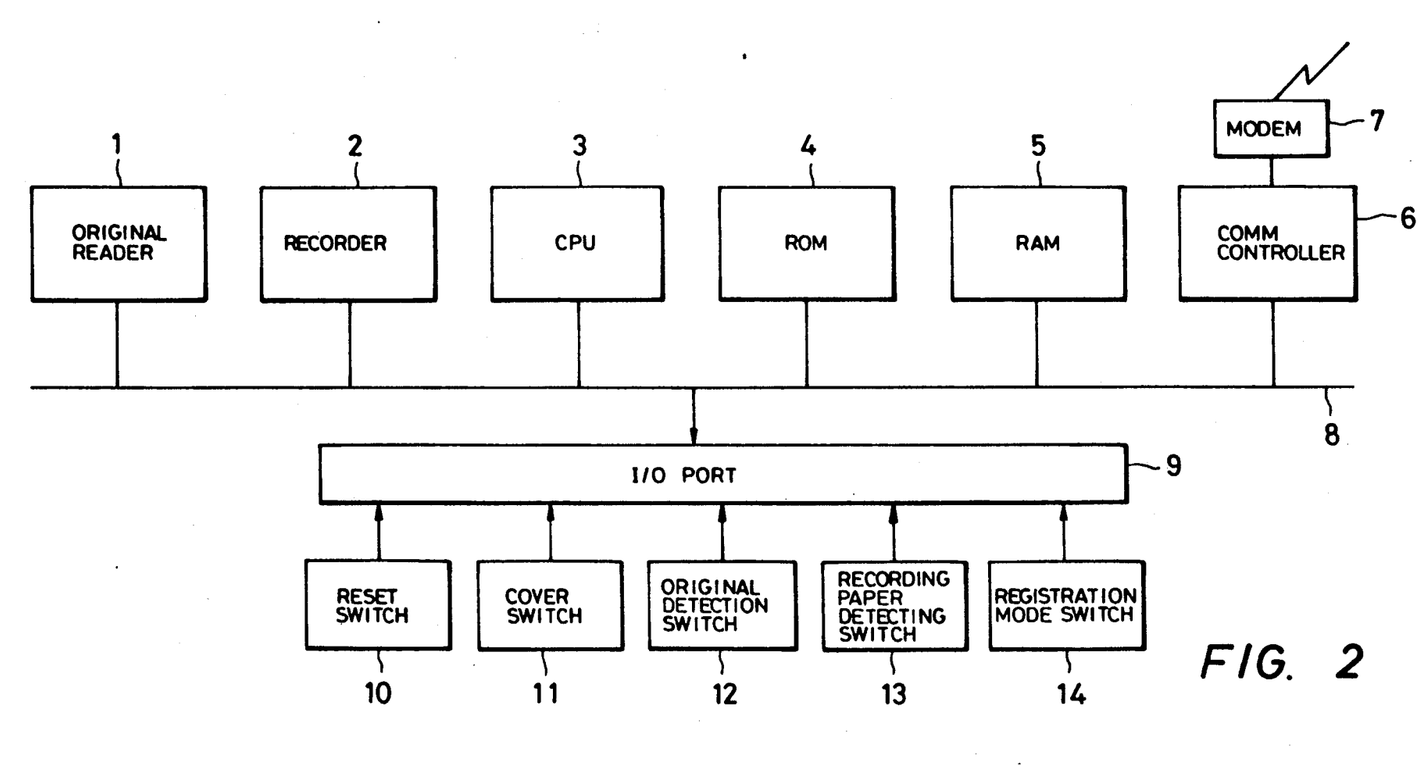
FIG. 2 shows a configuration of a facsimile machine.

FIG. 2 shows a block diagram of a facsimile machine in accordance with the present invention. An image signal of a document read by a document reader 1 is stored in a RAM 5 where it is encoded and sent to another facsimile machine through a communication controller 6 and a modem 7. On the other hand, image data from the other facsimile machine is stored in the RAM 5 through the modem 7 and the communication controller 6, encoded, and recorded on a record sheet by a recorder 2. The control for these events is executed by a CPU 3 in accordance with a program stored in the ROM 4. Those units are interconnected through a system bus 8.

The CPU 3 etc., is connected to various switches through the system bus 8 and an I/O put 9. A reset switch has a reset function similar to power-on reset. When it is depressed, the overall facsimile machine is initialized. A cover switch 11 is a switch for a case cover of the facsimile machine. When the cover is opened, the cover switch 11 is opened. A document switch 12 senses the presence of document, and a second sheet switch 13 senses the exhaust of record sheets. A registration mode switch 14 sets a mode for registering data necessary for facsimile transmission and reception. The data registered may include the machine's own telephone number, telephone numbers of sendees, and formatted text to be added to each page of the transmission data. The registration mode is used only to register the data. When the facsimile machine is in the registration mode, a predetermined area in the RAM is write-enabled.

FIGS. 3 to 6 show details of the embodiment of FIG. 2.

Figure 3:
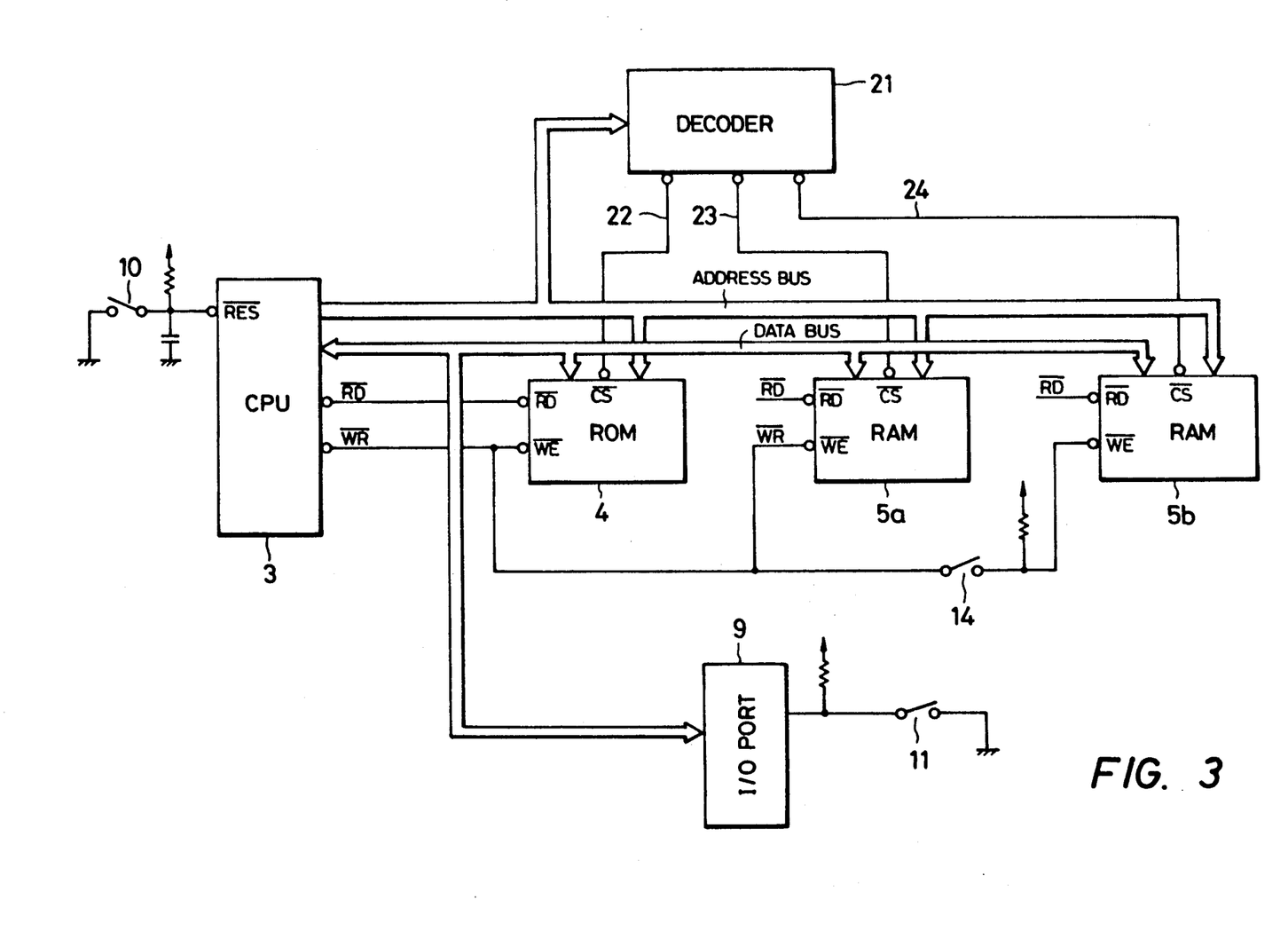
FIG. 3 shows a configuration of an embodiment in which write enablement is controlled by a switch.

FIG. 3 shows a configuration of a first embodiment. Numeral 3 denotes a CPU for controlling the overall system, numeral 4 denotes a ROM which contains a program, numeral 5b denotes a RAM which stores information such as telephone numbers, numeral 5a denotes a RAM which is used as a work area necessary to execute the program such as a stack pointer, numeral 21 denotes an address decoder for generating a chip select signal (CS) to a memory chip, numeral 10 denotes a reset switch used when the CPU 3 overruns, numeral 14 denotes a registration mode switch for enabling registration of data to the RAM 5b, numeral 9 denotes an I/O port, and numeral 11 denotes a switch used as a sensor (for example, the cover switch 11 in FIG. 2).

When the switch 19 is ON, a WR1 signal ("1" represents a negative logic) is supplied to a write enable (WE) terminal of the RAM 5b so that the RAM 56 is enabled for reading and writing. When the registration mode switch 14 is OFF, the RAM 5b may be read any time but writing thereto is inhibited. When a telephone number is to be registered, the registration mode switch 14 is turned ON. After the registration, the registration mode switch 14 is turned OFF to restore the normal mode so that the writing is inhibited even if the CPU 3 overruns.

Figure 4:
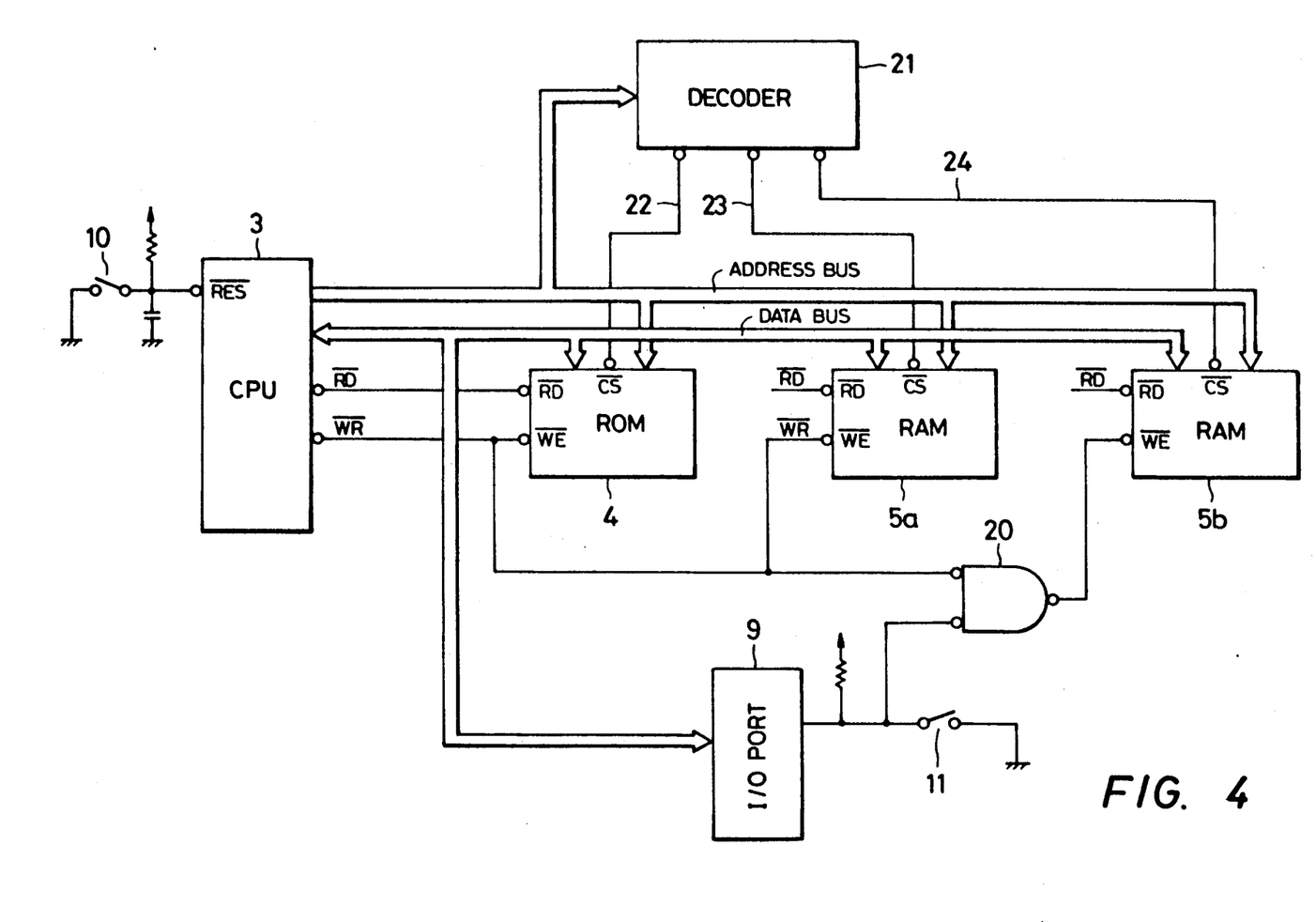
FIG. 4 shows an embodiment which uses an output of a cover switch.

FIG. 4 shows a configuration of a second embodiment. The switch 11 senses the open/close state of the cover. When the cover is closed, the switch is ON, and when the cover is open, the switch is OFF. The CPU 3 senses the open/close state of the cover through the I/O port 9. The output of the switch 11 is connected to a gate 20. The WR/signal is supplied to the other input of the gate 20. The output of the gate 20 is connected to the WE terminal of the RAM 5b. Only when the cover open, is writing to the RAM 5b is enabled. When the cover is closed, the WE signal to the RAM 5b is inhibited by the gate 20 so that writing to the RAM 5b is inhibited. When the telephone number is to be registered, it is registered while the cover is open, and after the registration, the cover is closed to restore the normal state. Since the cover is closed in the normal state, writing to the RAM 5b is inhibited even if the CPU overruns, and the data is not destroyed.

Figure 5:
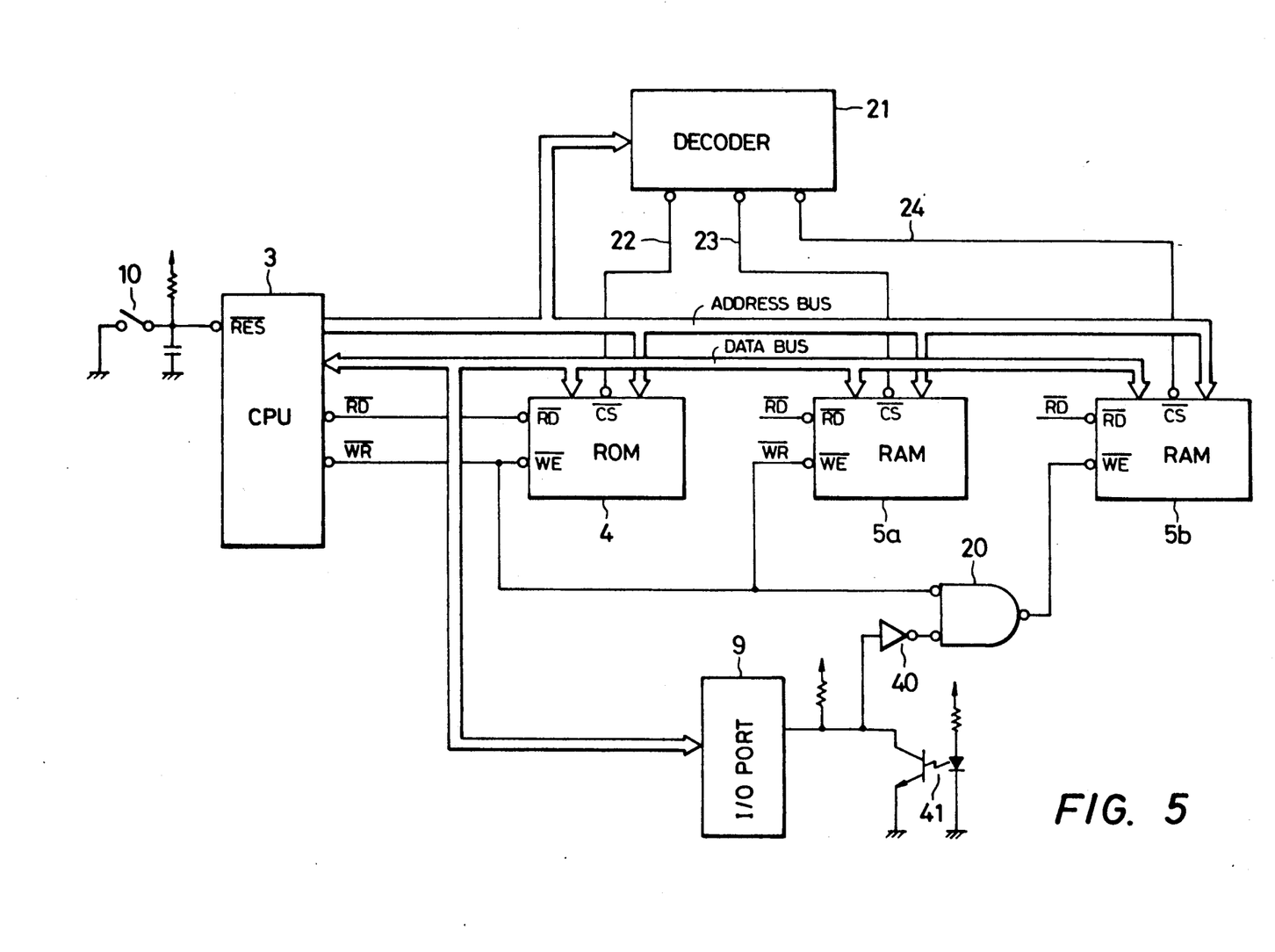
FIG. 5 shows an embodiment which uses a photosensor as a sensor.

FIG. 5 shows a configuration of a third embodiment. In the present embodiment, the switch used as a sensor is a reflection or transmission type photo-sensor 41. The basic operation is essentially same as that of FIG. 4. If the logic of the sensor in the normal state is inverse, an inverter 40 is inserted between the sensor 41 and the gate 20 so that writing to the RAM 5b is enabled in other than the normal state.

Figure 6:
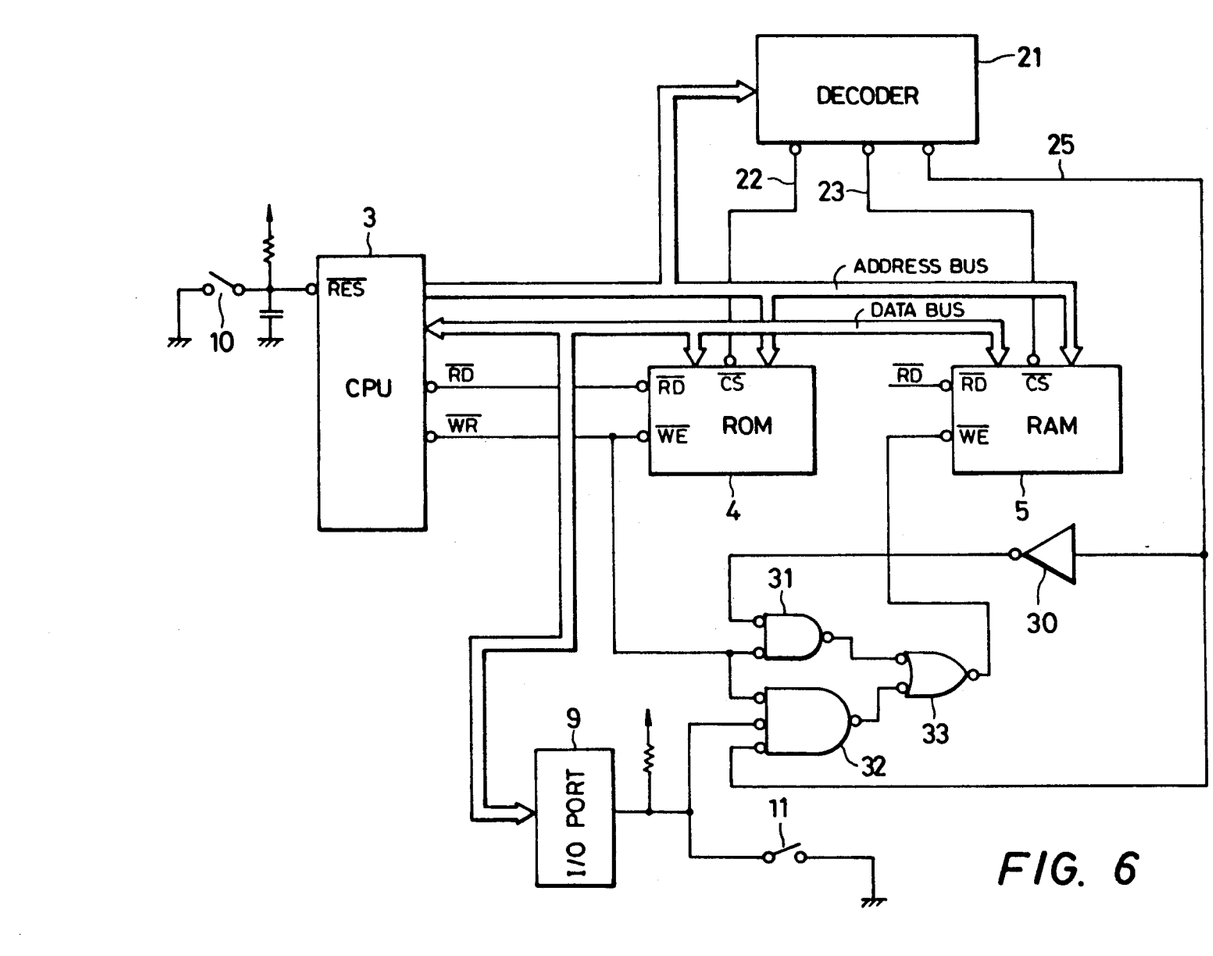
FIG. 6 shows an embodiment which protects an area in a RAM.
Figure 7:
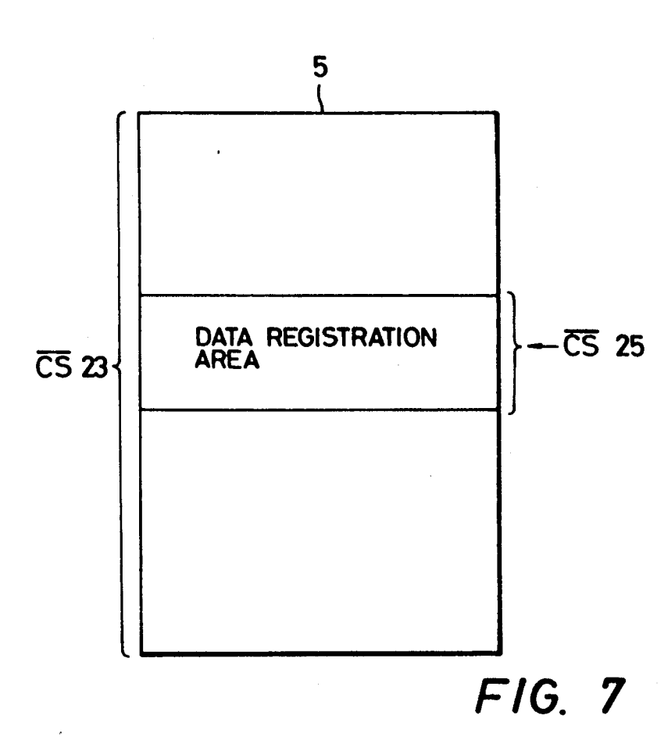
FIG. 7 shows area mapping of the memory in the embodiment of FIG. 6.

FIG. 6 shows a configuration of a fourth embodiment. In the present embodiment, a memory chip is divided into a work area and a registration area. Namely, a RAM 5 has a working area as shown in FIG. 7. In order to protect a portion of the areas of the RAM 5, two chip select signals CS23 and CS25 are generated by a decoder 21. When any area of the RAM 5 is to be accessed, CS23 is true, and when the data registration area is to be accessed, CS25 is true. The cover switch 11 is DN in the open state, and OFF in the closed state. The cover is open when the data is to be registered, and normally closed. When the writing is done to the RAM 5, a gate 33 produces the following signal by a logic circuit comprising gates 31, 32 and 33.

When the cover is open, the WE signal is true to any area. When the cover is closed, the output of the gate 33 is H (write inhibit) because the switch 11 is open. The gate 31 is open and the WR signal is produced only when writing is to be done to other than the data registration area. Accordingly, when the cover is closed, writing to the area of CS25 is inhibited.

In accordance with the facsimile machines shown in FIGS. 3 to 5, destruction of the registered data is prevented in the case of trouble such as an overrun of the CPU. The use of the cover switch also as the switch to control the write enable signal offers an advantage. In the embodiment of FIG. 6, the writing is selectively enabled by the logical address of the RAM.

In accordance with the present invention, writing to the memory is forcibly inhibited except when the writing is required so that destruction of valuable data by the malfunction is prevented.

While the invention has been explained with reference to the preferred ebodiments, which are facsimile machines the present invention is applicable to not only the facsimile machine but also any electronic equipment having a memory.

Various modifications of the above embodiments may be made without departing from the present invention.

What I claimed is:

1. An electronic equipment comprising:
   memory means for storing information;
   control means adapted to write information in said memory means which is input by a manual operation;
   manual select means for inhibiting the writing of information in said memory means, responsive to manual actuation of said manual select means; and
   gate means for intercepting a write enable signal to be sent from said control means to said memory means, in accordance with an output from said manual select means.

2. An equipment according to claim 1, wherein said gate means intercepts the write enable signal by means of hardware.

3. An equipment according to claim 1, wherein said control means reads out information from said memory means.

4. An equipment according to claim 1, wherein said manual select means is a manual switch.

5. An electronic equipment comprising:
   memory means for storing information;
   control means for controlling the writing of information into said memory means and the reading of information from said memory means, wherein said control means writes information in said memory means which is input by a manual operation;
   manual select means for inhibiting the writing of information into said memory means, responsive to manual actuation of said manual select means; and
   gate means for intercepting a write enable signal from said control means to said memory means, by means of hardware, in response to an output from said manual select means.

6. An equipment according to claim 5, wherein said manual select means is a manual switch.

7. An electronic equipment according to claim 5, wherein said memory means has a plurality of areas, and said gate means controls the writing of information to a predetermined area of said memory means.

8. An electronic equipment according to claim 5, further comprising read means for reading a document, transmission means for transmitting document data read by said read means, and control means for controlling said read means and said transmission means and writing information into said memory means.

9. An electronic equipment comprising:
   memory means for storing information;
   control means adapted to write information in said memory means;
   manual select means for inhibiting the writing of information in said memory means, responsive to manual actuation of said manual select means; and
   gate means for intercepting a write enable signal from said control means to said memory means in response to an output from said manual select means, wherein said memory means has a plurality of areas, and said gate means intercepts the writing of information to a predetermined area of said memory means.

10. An electronic equipment comprising:
    memory means for storing information;

control means adapted to write information in said memory means;

manual select means for inhibiting the writing of information in said memory means, responsive to manual actuation of said manual select means;

gate means for intercepting a write enable signal from said control means to said memory means, in response to an output from said manual select means;

read means for reading a document;

transmission means for transmitting document data read by said read means; and control means for controlling said read means and said transmission means and writing information into said memory means.

11. An electronic equipment comprising:

memory means for storing information which has a plurality of areas;

control means for controlling the writing of information into said memory means and the reading of information from said memory means;

manual select means for inhibiting the writing of information into said memory means, responsive to manual actuation of said manual select means; and gate means for intercepting a write enable signal from said control means to said memory means, by means of hardware, in response to an output from said manual select means, wherein said gate means controls the writing of information to a predetermined area of said memory means, and wherein said control means writes information in said memory means which is input by a manual operation.

12. An electronic equipment according to claim 11, wherein said manual select means is a manual switch.

* * * * *

UNITED STATES PATENT AND TRADEMARK OFFICE
CERTIFICATE OF CORRECTION

PATENT NO. : 5,130,946

DATED : July 14, 1992

INVENTOR(S) : Tsunehiro Watanabe

It is certified that error appears in the above-identified patent and that said Letters Patent is hereby corrected as shown below:

COLUMN 4

Line 6, "claimed" should read --claim--.

COLUMN 1

Line 16, "may be" should read --is--
and "is" should read --may be--.
Line 30, "a" (second occurrence) should be deleted.
Line 34, "senders." should read --sendees.--.
Line 48, "of" should read --in--.
Line 52, "of" should read --in--.
Line 64, "write enablement" should read
--write-enablement--.

COLUMN 2

Line 31, "CPU 3 etc.," should read --CPU 3, etc.,--.
Line 32, "I/O put 9." should read --I/O port 9.--.
Line 67, "RAM 56" should read --RAM 5b--.

UNITED STATES PATENT AND TRADEMARK OFFICE
CERTIFICATE OF CORRECTION

PATENT NO. : 5,130,946

DATED : July 14, 1992

INVENTOR(S) : Tsunehiro Watanabe

It is certified that error appears in the above-identified patent and that said Letters Patent is hereby corrected as shown below:

COLUMN 3

Line 14, "WR/signal" should read --WR signal--.
Line 29, "same" should read --the same--.
Line 43, "DN" should read --ON--.
Line 68, "machines" should read --machines,--.

Signed and Sealed this

Fifth Day of October, 1993

*Attest:*

BRUCE LEHMAN

*Attesting Officer*  Commissioner of Patents and Trademarks